(12) United States Patent
Ikeda (10) Patent No.: US 6,411,564 B2
(45) Date of Patent: Jun. 25, 2002

(54) SEMICONDUCTOR MEMORY DEVICE AND SYNCHRONOUS MEMORY

(75) Inventor: Shinichiro Ikeda, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/855,656

(22) Filed: May 16, 2001

(30) Foreign Application Priority Data

May 17, 2000 (JP) ........................................ 2000-145262

(51) Int. Cl.$^7$ ................................................ G11C 7/00
(52) U.S. Cl. .................................. 365/233; 365/189.01
(58) Field of Search ........................... 365/233, 189.01, 365/233.5

(56) References Cited

U.S. PATENT DOCUMENTS 6,002,615 A * 12/1999 Sawada .................. 365/189.01
6,188,639 B1 * 2/2001 Sakakibara ................. 365/233

* cited by examiner

*Primary Examiner*—Tan T. Nguyen
(74) *Attorney, Agent, or Firm*—Arent Fox Kintner Plotkin & Kahn, PLLC (57) ABSTRACT

The present invention provides a semiconductor memory device for storing data. The semiconductor memory device performs data masking without increasing power consumption regardless of latency. The device includes a data output circuit for receiving and outputting the stored data. A mask signal input circuit receives a mask signal used to mask the data output from the data output circuit and provides the mask signal to the data output circuit. An input control circuit generates an activation signal that activates the mask signal input circuit and provides the activation signal to the mask signal input circuit. The input control circuit generates the activation signal based on a mode setting signal and a latency determination signal. The mode setting signal is used to activate the mask signal input circuit and set an operation mode of the semiconductor memory device. The latency determination signal has a level corresponding to latency information.

15 Claims, 5 Drawing Sheets

SEMICONDUCTOR MEMORY DEVICE AND SYNCHRONOUS MEMORY

BACKGROUND OF THE INVENTION

The present invention relates to a semiconductor memory device. More particularly, it relates to a semiconductor memory device having a data masking function and outputs data based on a plurality of CAS latencies.

The reading and writing of data in a synchronous DRAM is synchronized with a clock signal. A synchronous DRAM having a data masking function and outputs data based on a plurality of CAS latencies has been proposed. Recent portable electronic equipment requires low power consumption devices to lengthen the battery life and prolong operational time. Accordingly, a synchronous DRAM installed in portable electronic equipment must have low power consumption while ensuring the masking of output data.

A synchronous DRAM has an active mode, an idle mode, and a power down mode. During the active mode, data is read and written. During the idle mode, part of an input/output (i/o) circuit is inactivated to decrease power consumption. During the power down mode, most of the i/o circuit is inactivated to decrease power consumption. The power consumption is maximal during the active mode, and the power consumption is minimal during the power down mode. The power consumption during the idle mode is intermediate and corresponds to a level between the power consumption levels of the active mode and the power down mode.

Figure 1:
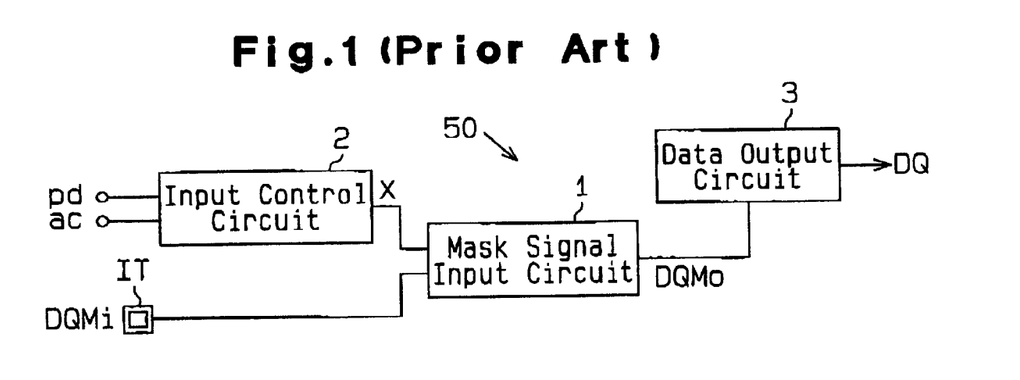
FIG. 1 is a schematic block diagram partially showing a first prior art semiconductor memory device.

A prior art synchronous DRAM 50 is shown in FIG. 1. The synchronous DRAM 50 includes a mask signal input circuit 1, an input control circuit 2, and a data output circuit 3. The synchronous DRAM 50 has an output data masking function and outputs data based on CAS latencies.

The mask signal input circuit 1 generates a mask output signal DQMo to mask output data based on a mask signal DQMi provided from an external input terminal IT.

The input control circuit 2 receives a power down signal pd and an active signal ac and controls the activation and inactivation of the mask signal input circuit 1 based on the power down signal pd and the active signal ac.

When the power down signal pd goes low during the power down mode, the input control circuit 2 generates an activation signal X at a low level and sends the low activation signal (inactivation signal) X to the mask signal input circuit 1. When the active signal ac goes high during the active mode, the input control circuit 2 generates an activation signal X at a high level and sends the high activation signal X to the mask signal input circuit 1.

When the power down signal pd and the active signal ac are low during the idle mode, the input control circuit 2 generates the low activation signal X and sends the low activation signal X to the mask signal input circuit 1.

The activation signal X activates the mask signal input circuit 1. In this state, the mask signal input circuit 1 receives the mask signal DQMi and generates the mask output signal DQMo The mask signal input circuit 1 then sends the mask output signal DQMo to the data output circuit 3. When inactivated by the low activation signal X, the mask signal input circuit 1 stops providing the mask output signal DQMo to the data output circuit 3.

Figure 3:
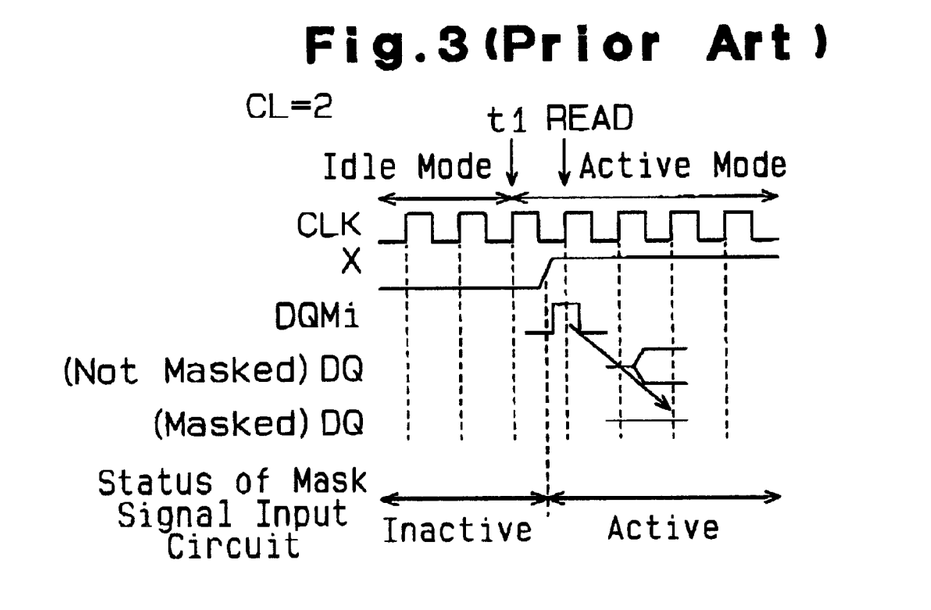
FIG. 3 is a combined timing and waveform chart showing the operation of the semiconductor memory device of FIG. 1.

The operation of the synchronous DRAM 50 is shown in FIG. 3 illustrating a data read operation performed when a CAS latency CL is 2.

During the idle mode, the low activation signal X inactivates the mask signal input circuit 1. Then, when a clock signal CLK goes high at time t1, the input control signal 2 receives the high active signal ac and sends the high activation signal X to the mask signal input circuit 1. This activates the mask signal input circuit 1.

One cycle of the clock signal CLK after time t1, the synchronous DRAM 50 receives a read command READ. Two cycles of the clock signal CLK after time t1, the data output circuit 3 outputs read data DQ.

When masking the data DQ output based on the first read command READ, the mask signal DQMi received by the mask signal input circuit 1 goes high at the same time as when the synchronous DRAM 50 receives the read command READ. Afterward, the mask signal input circuit 1 sends the mask output signal DQMo to the data output circuit 3. Based on the mask output signal DQMo, the data output circuit 3 masks the read data DQ.

A latency LQRM of the mask signal DQMi is normally set to a value of 2 or greater. Thus, the timing at which the mask signal DQMi is provided to the mask signal input circuit 1 is one or more clock signal CLK cycles prior to the timing at which the output of the data DQ is started.

During the idle mode, the mask signal input circuit 1 is inactivated regardless of the level of the mask signal DQMi, Thus, the power consumption is decreased during the idle mode.

During the active mode, the mask signal input circuit 1 is activated. In this state, the mask signal input circuit 1 receives the mask signal DQMi and generates the mask output signal DQMo based on the mask signal DQMi. Further, the data output circuit 3 receives the mask output signal DQMo and masks the data DQ output based on the first read command READ.

During the power down mode, the input control circuit 2 provides the mask signal input circuit 1 with the low activation signal X based on the high power down signal pd. The low activation signal X inactivates the mask signal input circuit 1, and thus decreases power consumption.

Figure 4:
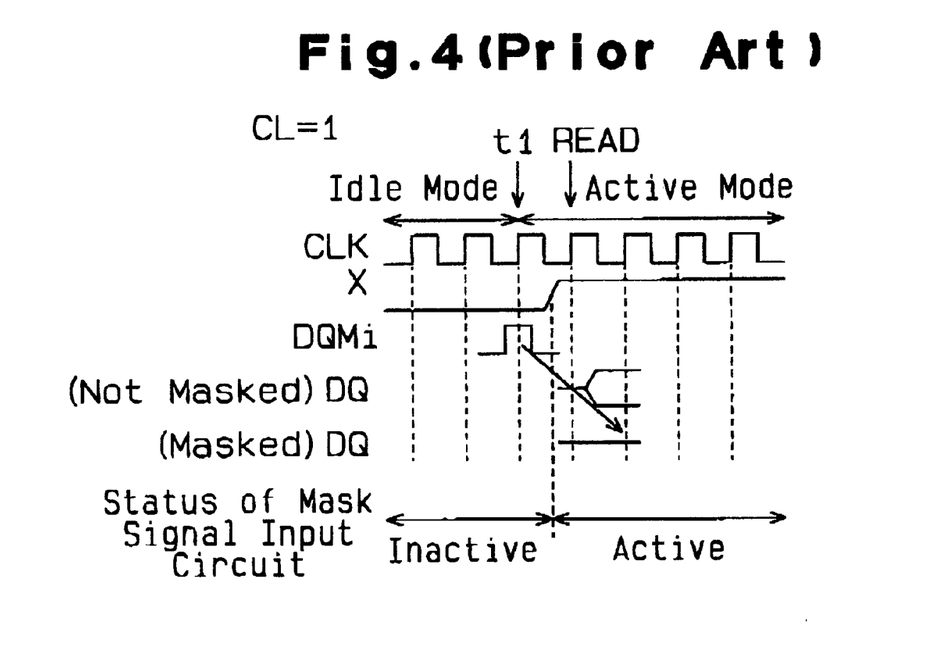
FIG. 4 is a combined timing and waveform chart showing the operation of the semiconductor memory device of FIG. 1.

In the synchronous DRAM 50, the CAS latency is switched between the values of one and two or greater. The operation performed, when the CAS latency is 1, is shown in FIG. 4.

During the idle mode, the low activation signal X inactivates the mask signal input circuit 1. Then, when the clock signal CLK goes high at time t1, the input control signal 2 receives the high active signal ac and sends the activation signal X to the mask signal input circuit 1.

One cycle of the clock signal CLK after time t1, the synchronous DRAM 50 receives the read command READ. Afterward, the data output circuit 3 outputs the data DQ within one cycle of the clock signal CLK after time t1.

Since the latency LRQM is 2, to mask the data DQ output based on the first read command READ, the mask signal input circuit 1 must receive the mask signal DQMi at the same time as when the active mode starts.

However, the input control circuit 2 generates the activation signal X after receiving the active signal ac and activates the mask signal input circuit 1 with the activation signal X. Thus, the mask signal input circuit 1 cannot generate the mask output signal DQMo at the same time as when the input control circuit 2 receives the active signal ac. As a result, the data DQ that is output based on the first read command READ is not masked when the CAS latency CL is 1.

Figure 2:
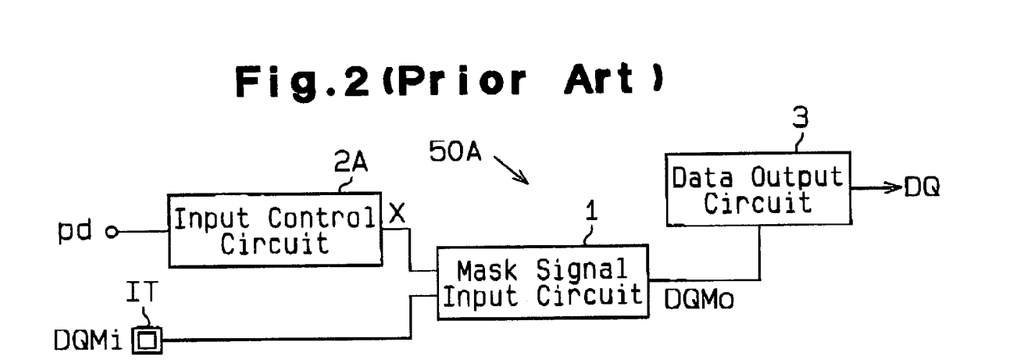
FIG. 2 is a schematic block diagram partially showing a second prior art semiconductor memory device.

FIG. 2 shows a synchronous DRAM 50A proposed to solve this problem. The synchronous DRAM 50A includes an input control circuit 2A receiving only the power down signal pd. The input control circuit 2A generates the low activation signal X when the power down signal pd goes high.

In this case, the mask signal input circuit 1 is activated during the idle mode. Thus, the mask signal input circuit 1 acquires the mask signal DQMi at the same time as when the active mode is started. As a result, the data DQ output based on the first read command READ is masked even if the CAS latency is 1 and the latency LRQM is 2.

However, when the mask signal DQMi is simultaneously provided to, for example, a plurality of banks or chips, the mask signal input circuits 1 in the banks or chips are activated during the idle mode. Thus, the mask signal DQMi provided to each mask signal input circuit 1 increases the power consumed by the mask signal input circuit 1 and the circuit in the next stage.

Further, the mask signal input circuit 1 is activated during the idle mode even when the CAS latency is set at a value of 2 or greater. This increases power consumption.

SUMMARY OF THE INVENTION

It is an object of the present invention to provide a semiconductor memory device performing data masking without increasing power consumption regardless of latency.

The present invention provides a semiconductor memory device for storing data. The semiconductor memory device includes a data output circuit for receiving and outputting the stored data. A mask signal input circuit is connected to the data output circuit for receiving a mask signal used to mask the data output from the data output circuit and providing the mask signal to the data output circuit. An input control circuit is connected to the mask signal input circuit for generating an activation signal that activates the mask signal input circuit and providing the activation signal to the mask signal input circuit. The input control circuit generates the activation signal based on at least one of a plurality of mode setting signals and a latency determination signal. The mode setting signal is used to activate the mask signal input circuit and selectively set one of a plurality of operation modes of the semiconductor memory device. The latency determination signal has a level corresponding to latency information.

A further perspective of the present invention is a semiconductor memory device for storing data. The semiconductor memory device includes a data input circuit for receiving the data. A mask signal input circuit is connected to the data input circuit for receiving a mask signal used to mask the data and providing the mask signal to the data input circuit. An input control circuit is connected to the mask signal input circuit for generating an activation signal that activates the mask signal input circuit and providing the activation signal to the mask signal input circuit. The input control circuit generates the activation signal based on at least one of a plurality of mode setting signals and a latency determination signal. The mode setting signal is used to activate the mask signal input circuit and selectively set one of a plurality of operation modes of the synchronous memory. The latency determination signal has a level corresponding to latency information.

Another perspective of the present invention is a synchronous memory for storing data based on a clock signal and reading stored data. The synchronous memory includes a data output circuit for receiving and outputting the stored data based on the clock signal. A mask signal input circuit is connected to the data output circuit for receiving a mask signal used to mask the data output from the data output circuit and providing the mask signal to the data output circuit. An input control circuit is connected to the mask signal input circuit for generating an activation signal that activates the mask signal input circuit and providing the activation signal to the mask signal input circuit. The input control circuit generates the activation signal based on at least one of a plurality of mode setting signals and a latency determination signal. The mode setting signal is used to activate the mask signal input circuit and selectively set one of a plurality of operation modes of the synchronous memory. The latency determination signal has a level corresponding to latency information.

A further perspective of the present invention is a synchronous memory for storing data based on a clock signal and reading stored data. The synchronous memory includes a data input circuit for receiving the data, a mask signal input circuit connected to the data input circuit for receiving a mask signal used to mask the data and providing the mask signal to the data input circuit, and an input control circuit connected to the mask signal input circuit for generating an activation signal that activates the mask signal input circuit and providing the activation signal to the mask signal input circuit. The input control circuit generates the activation signal based on at least one of a plurality of mode setting signals and a latency determination signal. The mode setting signal is used to activate the mask signal input circuit and selectively set one of a plurality of operation modes of the synchronous memory. The latency determination signal has a level corresponding to latency information.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 5:
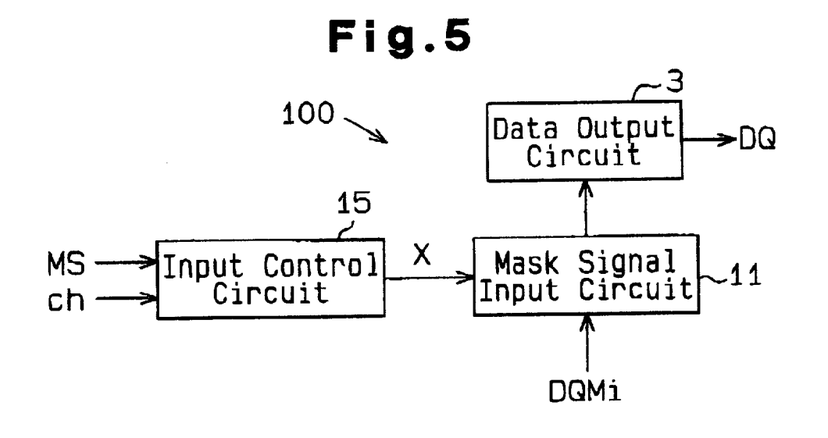
FIG. 5 is a schematic block diagram partially showing a semiconductor memory device according to a first embodiment of the present invention.

FIG. 5 is a schematic block diagram partially showing a semiconductor memory device 100 according to a first embodiment of the present invention. The semiconductor memory device 100 includes a data output circuit 3, a mask signal input circuit 11, and an input control circuit 15. The data output circuit 3 receives and outputs the stored data. The mask signal input circuit 11 receives a mask signal for masking the data output from the data output circuit 3 and sends the mask signal to the data output circuit 3. The input control circuit 15 generates an activation signal X for activating the mask signal input circuit 11 and sends the activation signal X to the mask signal input circuit 11.

The input control circuit 15 generates the activation signal X based on a mode setting signal MS and a latency determination signal ch. The mode setting signal MS is used to activate the mask signal input circuit 11 and set the operation mode of the semiconductor memory device 100. The latency determination signal ch has a level corresponding to latency information.

Accordingly, if the CAS latency is set to 1 and the operation mode is in the idle mode, the generation of the activation signal X with the input control circuit 15 and the activation of the mask signal input circuit 11 are enabled. The data output circuit 3 thus masks the output data based on the mask signal of the mask signal input circuit 11 when entering the active mode from the idle mode even if the CAS latency is 1.

Figure 6:
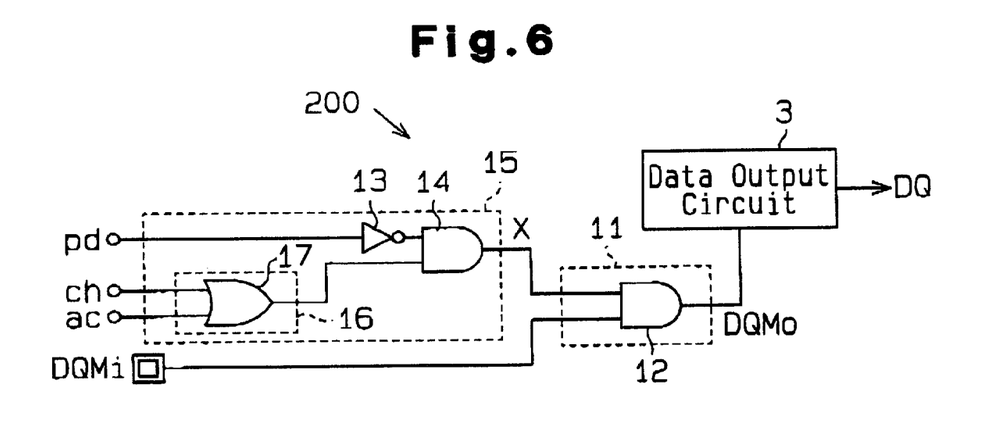
FIG. 6 is a schematic block diagram partially showing a semiconductor memory device according to a second embodiment of the present invention.

FIG. 6 is a schematic block diagram partially showing a semiconductor memory device 200 according to a second embodiment of the present invention. The semiconductor memory device 200 includes a data output circuit 3, a mask signal input circuit 11, and an input control circuit 15. The semiconductor memory device of the second embodiment is applied to a synchronous DRAM.

The mask signal input circuit 11 includes an AND circuit 12. A first input terminal of the AND circuit 12 receives a mask signal DQMi. The input control circuit 15 includes an inverter 13, an AND circuit 14, and a switching circuit 16. The inverter 13 receives a power down signal pd and generates an inverted version of the power down signal pd. The inverted power down signal pd is provided to a first input terminal of the AND circuit 14.

The switching circuit 16 includes an OR circuit 17. The OR circuit 17 has a first input terminal receiving an active signal ac and a second input terminal receiving a latency determination signal ch. The latency determination signal ch has a high potential level when the CAS latency CL is 1, and a low potential when the CAS latency is 2 or greater. The power down signal pd and the active signal ac are the same as those of the prior art.

Figure 7:
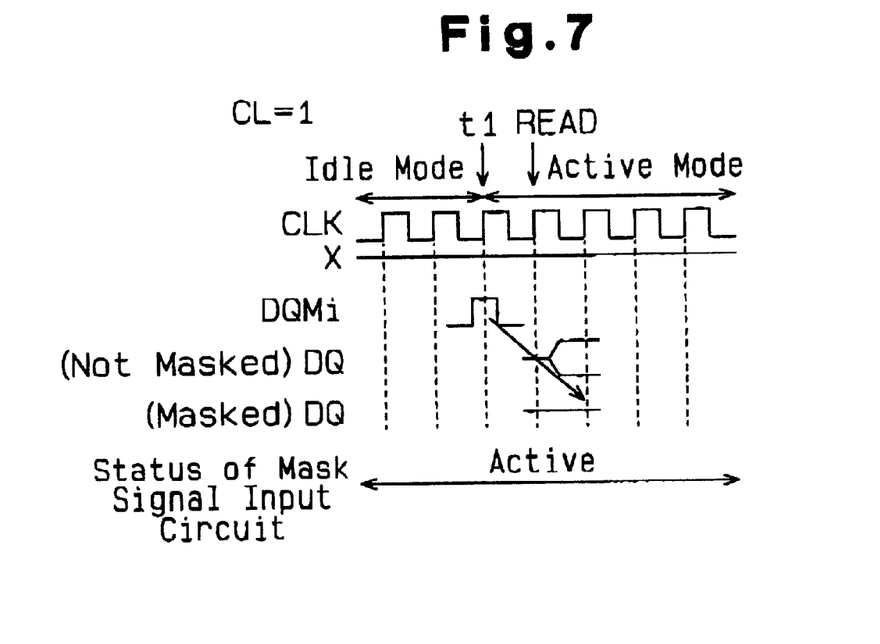
FIG. 7 is a combined timing and waveform chart showing the operation of the semiconductor memory device of FIG. 6.

The CAS latency CL of the synchronous DRAM 200 is switched between 1 and 2 or greater. The operation of the DRAM 200, when the CAS latency CL is 1, is shown in FIG. 7.

When the CAS latency CL is 1, the latency determination signal ch has a high potential level, and the level of the output signal of the OR circuit 17 is high regardless of the active signal ac. During a mode other than the power down mode, the input signals of the AND circuit 14 are both high. Thus, the AND circuit 14 generates an activation signal X at a high level, and provides the activation signal X to a second input terminal of the AND circuit 12. In other words, the input control circuit 15 generates the activation signal X during the idle mode and the active mode. The mask signal input circuit 11 is activated when it receives the activation signal X. In this state, the AND circuit 12 provides the data output circuit 3 with a mask signal DQMo. The phase of the mask signal DQMo is the same as the mask signal DQMi received by the first input terminal of the AND circuit 12.

In this state, the idle mode shifts to the active mode if the activation signal ac received by synchronous DRAM 200 goes high when a clock signal CLK goes high at time t1.

Subsequently, the synchronous DRAM 200 receives a read command READ after one cycle of the clock signal CLK from time t1, at which the clock signal CLK goes high. The data output circuit 3 then outputs the read data DQ within one clock signal CLK cycle subsequent to the receipt of the read command READ.

When the CAS latency CL is set to 1, the mask signal DQMi is provided to the mask signal input circuit 11 at the same time as when the active signal ac is provided to the switching circuit 16. In this state, the mask signal input circuit 11 has already been activated. Thus, the mask signal DQMo is provided from the mask signal input circuit 11 to the data output circuit 3. Accordingly, the data DQ, which is output based on the first read command READ, is masked in response to the mask signal DQMo even if the latency LRQM of the mask signal DQMi is 2.

Figure 8:
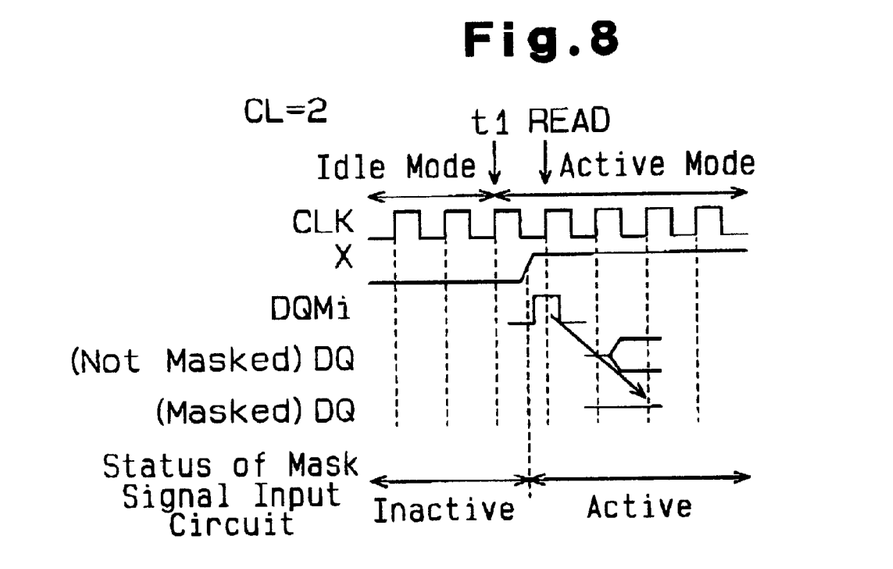
FIG. 8 is a combined timing and waveform chart showing the operation of the semiconductor memory device of FIG. 6.

The operation of the DRAM 200, when the CAS latency CL is 2, is shown in FIG. 8. When the CAS latency CL is 2, the latency determination signal ch has a low potential level, and the phase of the output signal of the OR circuit 17 provided to the second input terminal of the AND circuit 14 is the same as the active signal ac.

During the active mode, the input control circuit 15 generates the activation signal X. During the idle mode, the input control circuit 15 generates an activation signal X having a low potential level.

In the active mode, the phase of the mask signal DQMo provided from the AND circuit 12 to the data output circuit 3 is the same as the mask signal DQMi. In the idle mode, the output signal of the AND circuit 12 provided to the data output circuit 3 is low regardless of the mask signal DQMi. Accordingly, when the CAS latency is 2, the synchronous DRAM 200 is operated in the same manner as the prior art synchronous DRAM 50 of FIG. 3.

More specifically, during the idle mode, the input control circuit 15 provides the low activation signal (inactivation signal) X to the mask signal input circuit 11 for inactivating the mask signal input circuit 11. Thus, the output signal of the mask signal input circuit 11 provided to the data output circuit 3 is low regardless of the mask signal DQMi.

Then, when the clock signal CLK goes high at time t1, the active signal ac provided to the OR circuit 17 goes high, and the AND circuit 14 generates the activation signal X. One cycle of the clock signal CLK after time t1, the synchronous DRAM 200 receives the read command READ. Two cycles of the clock signal CLK after time t1, the data output circuit 3 outputs the read data DQ.

When masking the data DQ output based on the first read command READ, the activation signal X is provided to the mask signal input circuit 1 during the acquirement of the read command READ. Thus, the mask signal input circuit 1 receives the high mask signal DQMi at the same time as when the read command READ is acquired. Based on the mask output signal DQMo provided from the mask signal input circuit 1, the data output circuit 3 masks the output data DQ.

Accordingly, during the idle mode, the mask signal input circuit 11 (AND circuit 12) is inactivated regardless of the mask signal DQMi. This decreases power consumption during the idle mode.

During the active mode, the mask signal input circuit 11 is activated. Thus, the data output circuit 3 masks the data DQ, which is output in response to the first read command READ, based on the mask signal DQMo from the mask signal input circuit 11.

During the power down mode, the AND circuit 14 generates the low activation signal X based on the high power down signal pd regardless of the CAS latency CL. The low activation signal X inactivates the mask signal input circuit 11. In this state, the output signal DQMo is fixed at the low level. As a result, power consumption is decreased.

The synchronous DRAM 200 of the second embodiment has the advantages described below.

(1) When the CAS latency CL is set to a value of 2 or greater and the latency LRQM of the mask signal DQMi is set to a value of 2, the data DQ is masked in response to the first read command READ.

(2) When the CAS latency CL is set to a value of 2 or greater, the mask signal input circuit 11 is inactivated during the idle mode. This decreases power consumption.

(3) When the CAS latency CL is set to a value of 1 and the latency LRQM of the mask signal DQMi is set to a value of 2, the mask signal input circuit 11 is activated during the idle mode. Thus, the output data DQ is masked in response to the first read command READ.

It should be apparent to those skilled in the art that the present invention may be embodied in many other specific forms without departing from the spirit or scope of the invention. Particularly, it should be understood that the present invention may be embodied in the following forms.

Figure 9:
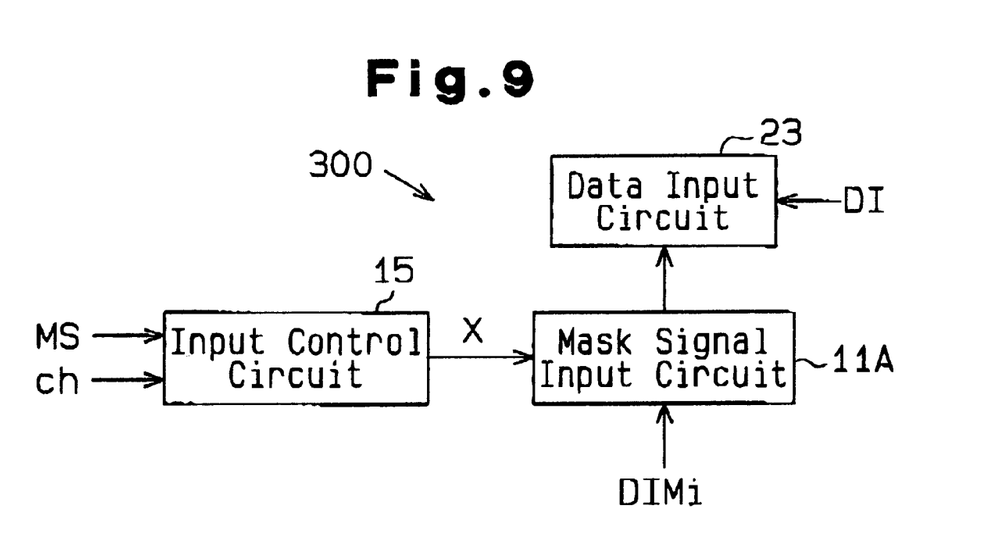
FIG. 9 is a schematic block diagram partially showing a semiconductor memory device according to a further embodiment of the present invention.

As shown in FIG. 9, the present invention may be applied to a semiconductor memory device (e.g., synchronous DRA) 300 having a mask input circuit 11A, which masks write data DI, and a data input circuit 23. The inactivation of the mask input circuit 11A, which receives a write mask signal DIMi, may be controlled based on a mode setting signal (e.g., power down signal, active signal) and a latency determination signal ch.

The present examples and embodiments are to be considered as illustrative and not restrictive, and the invention is not to be limited to the details given herein, but may be modified within the scope and equivalence of the appended claims.

What is claimed is:

1. A semiconductor memory device for storing data comprising:
   a data output circuit for receiving and outputting the stored data;
   a mask signal input circuit connected to the data output circuit for receiving a mask signal used to mask the data output from the data output circuit and providing the mask signal to the data output circuit; and
   an input control circuit connected to the mask signal input circuit for generating an activation signal that activates the mask signal input circuit and providing the activation signal to the mask signal input circuit, wherein the input control circuit generates the activation signal based on at least one of a plurality of mode setting signals and a latency determination signal, the mode setting signal being used to activate the mask signal input circuit and selectively set one of a plurality of operation modes of the semiconductor memory device, and the latency determination signal having a level corresponding to latency information.

2. The semiconductor memory device according to claim 1, wherein the latency information includes CAS latency and mask latency.

3. The semiconductor memory device according to claim 2, wherein the plurality of operation modes include an idle mode for decreasing power consumption, and the input control circuit provides the activation signal to the mask signal input circuit during the idle mode when the latency determination signal indicates that the CAS latency has a value smaller than that of the mask latency.

4. The semiconductor memory device according to claim 2, wherein the plurality of mode setting signals include a power down signal and an active signal, and the plurality of operation modes include a power down mode set by the power down signal, an active mode set by the active signal, and an idle mode for decreasing power consumption, and wherein the input control circuit stops providing the activation signal to the mask signal input circuit during the power down mode based on the mode setting signals, provides the activation signal to the mask signal input circuit during the active mode based on the mode setting signals, and provides the activation signal to the mask signal input circuit during the idle mode based on the latency determination signal.

5. The semiconductor memory device according to claim 4, wherein the input control circuit provides the activation signal to the mask signal input circuit during the idle mode when the latency determination signal indicates that the CAS latency has a value smaller than that of the mask latency.

6. The semiconductor memory device according to claim 1, wherein the plurality of operation modes include an idle mode, and the mask signal input circuit is activated during the idle mode when a value of the latency information corresponds to 1.

7. A synchronous memory for storing data and reading stored data based on a clock signal comprising:
   a data output circuit for receiving and outputting the stored data based on the clock signal;
   a mask signal input circuit connected to the data output circuit for receiving a mask signal used to mask the data output from the data output circuit and providing the mask signal to the data output circuit; and
   an input control circuit connected to the mask signal input circuit for generating an activation signal that activates the mask signal input circuit and providing the activation signal to the mask signal input circuit, wherein the input control circuit generates the activation signal based on at least one of a plurality of mode setting signals and a latency determination signal, the mode setting signal being used to activate the mask signal input circuit and selectively set one of a plurality of operation modes of the synchronous memory, and the latency determination signal having a level corresponding to latency information.

8. The synchronous memory according to claim 7, wherein the latency information includes CAS latency and mask latency.

9. The synchronous memory according to claim 8, wherein the plurality of operation modes includes an idle mode for decreasing power consumption, and the input control circuit provides the activation signal to the mask signal input circuit during the idle mode when the latency determination signal indicates that the CAS latency has a value smaller than that of the mask latency.

10. The synchronous memory according to claim 8, wherein the plurality of mode setting signals include a power down signal and an active signal, and the plurality of operation modes include a power down mode set by the power down signal, an active mode set by the active signal, and an idle mode for decreasing power consumption, and wherein the input control circuit stops providing the activation signal to the mask signal input circuit during the power down mode based on the mode setting signals, provides the activation signal to the mask signal input circuit during the active mode based on the mode setting signals, and provides the activation signal to the mask signal input circuit during the idle mode based on the latency determination signal.

11. The synchronous memory according to claim 10, wherein the input control circuit provides the activation signal to the mask signal input circuit during the idle mode when the latency determination signal indicates that the CAS latency has a value smaller than that of the mask latency.

12. The synchronous memory according to claim 11, wherein the input control circuit includes a switching circuit for generating a switching signal based on a logic operation performed with the active signal and the latency determination signal, and generates the activation signal based on a logic operation performed with the switching signal and the power down signal.

13. A synchronous memory for storing data and reading stored data based on a clock signal comprising:

a data input circuit for receiving the data;

a mask signal input circuit connected to the data input circuit for receiving a mask signal used to mask the data and providing the mask signal to the data input circuit; and an input control circuit connected to the mask signal input circuit for generating an activation signal that activates the mask signal input circuit and providing the activation signal to the mask signal input circuit, wherein the input control circuit generates the activation signal based on at least one of a plurality of mode setting signals and a latency determination signal, the mode setting signal being used to activate the mask signal input circuit and selectively set one of a plurality of operation modes of the synchronous memory, and the latency determination signal having a level corresponding to latency information.

14. A semiconductor memory device comprising:

a data mask signal input circuit receiving a data mask signal;

an input control circuit for outputting an activation signal to the data mask signal input circuit in response to an operation mode signal and a latency signal.

15. A semiconductor memory device for storing data comprising:

a data input circuit for receiving the data;

a mask signal input circuit connected to the data input circuit for receiving a mask signal used to mask the data and providing the mask signal to the data input circuit; and an input control circuit connected to the mask signal input circuit for generating an activation signal that activates the mask signal input circuit and providing the activation signal to the mask signal input circuit, wherein the input control circuit generates the activation signal based on at least one of a plurality of mode setting signals and a latency determination signal, the mode setting signal being used to activate the mask signal input circuit and selectively set one of a plurality of operation modes of the semiconductor memory device, and the latency determination signal having a level corresponding to latency information.

* * * * *